United States Patent [19]

Itoh

[11] Patent Number: 5,059,831
[45] Date of Patent: Oct. 22, 1991

[54] BUFFER CIRCUIT WITH AN ELECTROSTATIC PROTECTOR

[75] Inventor: Masashi Itoh, Yokohama, Japan

[73] Assignee: Kabushiki Kaisha Toshiba, Kawasaki, Japan

[21] Appl. No.: 494,315

[22] Filed: Mar. 16, 1990

[30] Foreign Application Priority Data

Mar. 20, 1989 [JP] Japan .................................. 1-65862

[51] Int. Cl.[5] ..................... H01L 25/00; H01L 27/02; H03K 19/02; H03K 19/20

[52] U.S. Cl. ............................. 307/482.1; 307/303.1; 307/446; 307/456; 307/270; 357/48; 357/51; 361/212; 361/91

[58] Field of Search ................... 307/303.1, 317.1, 253, 307/254, , 270, 443, 296.4, 482.1, 456, 446, 457, 458; 361/91, 111, 212

[56] References Cited

U.S. PATENT DOCUMENTS

| | | |
|---|---|---|
| 3,512,009 | 5/1970 | Batte .............................. 307/317.1 |
| 3,742,250 | 6/1973 | Kan ................................ 307/317.1 |
| 4,028,564 | 6/1977 | Streit et al. ...................... 307/303 |
| 4,520,278 | 5/1985 | De Roo ........................... 307/317.1 |
| 4,536,701 | 8/1985 | Nagano ........................... 307/254 |
| 4,616,142 | 10/1986 | Upadhyay et al. ................ 307/254 |
| 4,808,461 | 4/1974 | Maximov et al. ................ 307/317.1 |
| 4,890,018 | 12/1989 | Fukushi et al. .................. 307/317.1 |

*Primary Examiner*—Stanley D. Miller
*Assistant Examiner*—Trong Phan
*Attorney, Agent, or Firm*—Banner, Birch, McKie & Beckett

[57] ABSTRACT

A buffer circuit comprises an interface node, a bipolar transistor having a collector connected to a first power source, an emitter connected to a second power source, and a base, for transferring a signal supplied to and from the interface node, and a diode structure formed between the emitter and base of the bipolar transistor, the diode structure containing a PN junction reversely coupled across the emitter-base junction of the bipolar transistor.

27 Claims, 6 Drawing Sheets

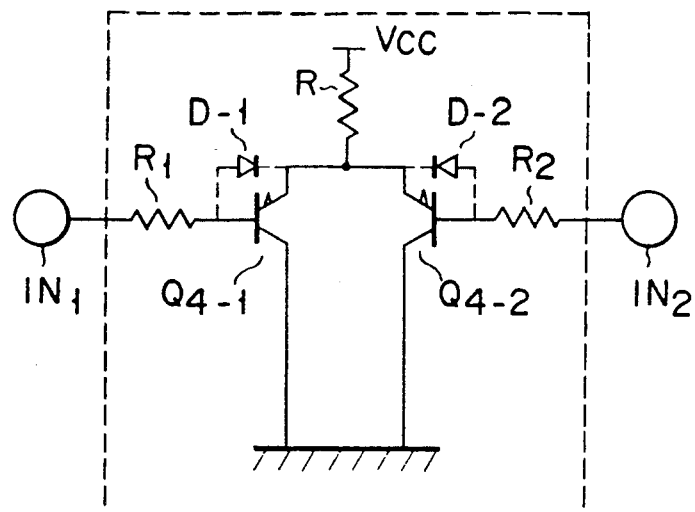
F I G. 16
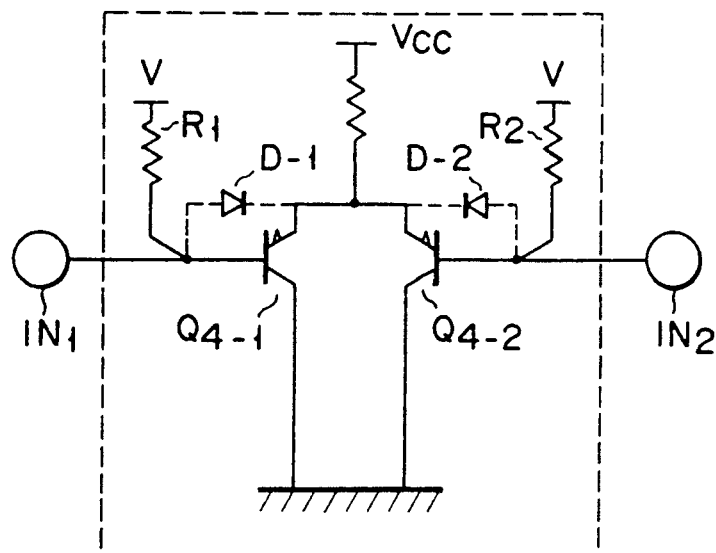
F I G. 17

BUFFER CIRCUIT WITH AN ELECTROSTATIC PROTECTOR

BACKGROUND OF THE INVENTION

1. Field of the Invention

The present invention relates to an electrostatic protector for protecting an input circuit or an output circuit of a semiconductor integrated circuit, and more particularly, to a circuit for protecting a base-emitter junction of a transistor against an incoming surge voltage.

2. Description of the Related Art

An electrostatic protector is installed in an output circuit of a semiconductor integrated circuit, such as is shown in FIG. 5 or FIG. 6, or in an input circuit such as that shown in FIG. 7. In the output circuit of the integrated circuit (IC) of FIG. 5, a collector-emitter path of an output NPN transistor $Q_1$ and a resistor R are connected in series between a Vcc power source line (referred to as a Vcc line) and a ground potential line (referred to as a ground line). The emitter of the transistor $Q_1$ is connected to an output terminal OUT. A diode $D_1$, for absorbing a positive surge current, is connected between the emitter of the transistor $Q_1$ and the Vcc line, while a diode $D_2$, for absorbing a negative surge current, is connected between the emitter of the transistor $Q_1$ and the ground line.

The diodes $D_1$ and $D_2$ of this protector respectively provide electrostatic protection for the junction between the base and emitter of the transistor $Q_1$ against positive and negative surge voltages coming in through the output terminal OUT.

In the output circuit of FIG. 6, a collector-emitter path of an output NPN transistor $Q_1$ and a resistor R are connected in series between a Vcc power source line (referred to as a Vcc or power line) and a ground potential line (referred to as a ground line). In this circuit, resistor R is P type diffusion resistor, and formed in N type resistor island, and the voltage potential Vcc is supplied to the resistor island. Therefore, a surge diode structure $D_{1-2}$ is equivalently formed between resistor R and Vcc. The emitter of the transistor $Q_1$ is connected to an output terminal OUT, and a diode $D_2$, for absorbing a negative surge current, is connected between the emitter of the transistor $Q_1$ and the ground line.

In the input circuit of FIG. 7, a resistor R is connected between the emitter of an input NPN transistor $Q_2$ and a ground line. The base of the transistor $Q_2$ is connected to an input terminal IN, and the collector thereof is connected to an internal circuit. A diode $D_1$, for absorbing a positive surge current, is connected between the base of the NPN transistor $Q_2$ and an Vcc line, while a diode $D_2$, for absorbing a negative surge current, is connected between the base of the transistor $Q_2$ and the ground line.

In the case of the above protector, the diodes $D_1$ and $D_2$ respectively provide electrostatic protection for the junction between the base and emitter of the transistor $Q_2$ against positive and negative surge voltages coming in through the input terminal IN.

Let us consider in detail a case where a surge voltage arrives at the output terminal OUT or the input terminal IN. If the surge voltage is negative, the ground line always exhibits a low impedance, and therefore a negative surge current caused by the negative surge voltage passes through the diode $D_2$. In other words, the negative surge current is absorbed by the diode $D_2$. If, on the other hand, the surge voltage is positive, the Vcc line exhibits a low impedance, a positive surge current caused by the positive surge voltage passes through the diode $D_1$ or the equivalent diode $D_{1-2}$. In other words, the positive surge current is absorbed by the diode $D_1$ or $D_{1-2}$. When the Vcc line is open, or in a high impedance state, a surge current absorbing path including the diode $D_1$ or $D_{1-2}$ is open, in which case the surge voltage, when positive, will destroy the base-emitter junction of the transistor $Q_1$ or $Q_2$.

Thus, in the case of a positive surge voltage, the electrostatic protecting circuit to which the present invention is not embodied fails to absorb the positive surge current by the related diode, when the Vcc or power line is in a high impedance state. Accordingly, the base-emitter junction of the NPN transistor will be possibly destroyed.

SUMMARY OF THE INVENTION

Accordingly, an object of the present invention is to provide a buffer circuit which is capable of protecting the base-emitter junction of an input or output bipolar transistor against a surge voltage coming in through an input node or an output node under any impedance state of the power line and/or ground line.

To achieve the above object, there is provided a buffer circuit comprising an interface node (IN, OUT), a bipolar transistor ($Q_1$, $Q_2$) having a collector connected to a first power source (Vcc), an emitter connected to a second power source (GND), and a base, a signal being transferred between the bipolar transistor and the interface node, and a diode structure (D) formed between the emitter and base of the bipolar transistor ($Q_1$, $Q_2$), the diode structure containing a PN junction reversely coupled across the emitter-base junction of the bipolar transistor.

With the buffer circuit arranged thus, a surge voltage coming in through the interface node (IN, OUT) is attenuated in the following way. A surge current caused by the surge voltage temporarily goes to a base-emitter path, but it is pulled to the diode structure (D) formed between the base and emitter, that is, it bypasses the bipolar transistor ($Q_1$, $Q_2$) and is absorbed by a circuit preceding or succeeding the transistor. The reason for this is that the PN junction of the diode structure is inversely coupled with the PN junction in the transistor structure. Accordingly, the protector absorbs the surge current, thereby protecting the PN or base-emitter junction contained in the transistor structure against an impact by the surge voltage.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 16 and 17 are circuit diagrams showing differential amplifiers incorporating an electrostatic protector according to the present invention.

DETAILED DESCRIPTION OF THE PREFERRED EMBODIMENTS

Embodiments of the present invention will be described hereinafter, with reference to the accompanying drawings.

Figure 1:
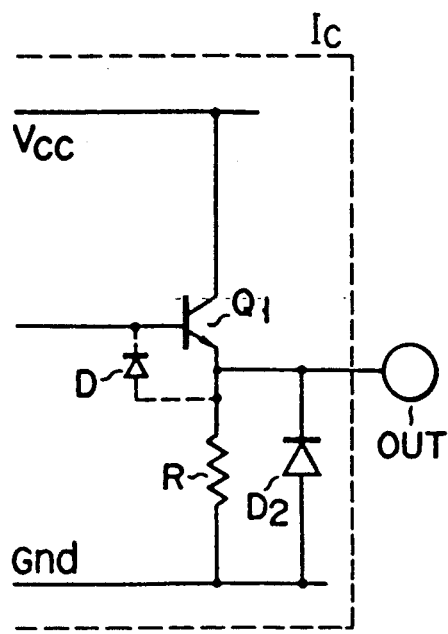
FIG. 1 is a circuit diagram showing an embodiment of an electrostatic protector according to the present invention.

FIG. 1 shows an emitter follower output circuit incorporating a static protector according to the present invention. As can be seen from this figure, a collector-emitter path of an output NPN transistor $Q_1$ and a resistor R are connected in series between a Vcc line and a ground line. The emitter of the transistor $Q_1$ is connected to an output terminal OUT, with a diode $D_2$ for absorbing a negative surge current being connected between the emitter of the transistor $Q_1$ and the ground line.

Figure 2:
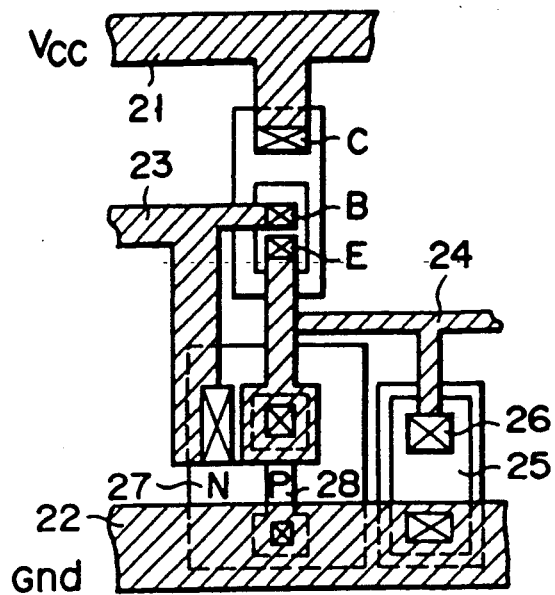
FIG. 2 is a pattern illustration of the electrostatic protector of FIG. 1.

The output circuit of FIG. 1 has a pattern as shown in FIG. 2, and, as can be seen from this figure, reference numeral 21 designates the Vcc line; 22, the ground line; C, B, and E, the collector, base, and emitter regions, respectively of the transistor $Q_1$; 23, a base interconnection wire; and 24, an emitter interconnection wire. A P type diffusion region 25 is in contact with the ground line 22, an N type region 26 within the P type diffusion region is in contact with the emitter interconnection 24, and a pn junction between the regions 25 and 26 forms the diode $D_2$.

An N type island (resistor island region) region 27 has an N type region of a high concentration formed therein, which is connected to the base interconnection wire 23. A resistor (resistor R) is also formed in the N type island 27, and has a P type diffusion region which is connected at one end to the emitter interconnection 24, and at the other end to the ground line 22. By virtue of this arrangement, the N type island 27 receives a potential equal to that of the base of the transistor $Q_1$.

When a negative surge voltage reaches the output terminal OUT of the output circuit of FIG. 1, the diode $D_2$ absorbs a negative surge current caused thereby, and protects the base-emitter junction of the transistor $Q_1$. An equivalent diode D, serving as a PN junction between the P type diffusion resistor region 28 and the N type island 27, is inversely connected between across the base-emitter junction of the NPN transistor $Q_1$. Thus, when a positive surge voltage comes in through the terminal OUT, the equivalent diode D is turned on before a voltage breakdown occurs at the junction between the base and emitter of the transistor $Q_1$. Accordingly, the voltage between the emitter and base of the transistor $Q_1$ is always placed below the forward voltage across the diode D. This indicates that the surge current can be absorbed by the equivalent diode D, thereby to protect the base-emitter junction of the transistor $Q_1$ against being destroyed by the positive surge voltage applied.

Thus, the equivalent diode D thus connected ensures protection of the base-emitter junction of the transistor $Q_1$ against the positive surge voltage, whatever the impedance state of the power line. Further, use of the equivalent diode D eliminates the diode $D_1$ connected between the emitter of the transistor $Q_1$ and the power line Vcc for absorbing the positive surge current used in prior art electrostatic protectors.

Figure 3:
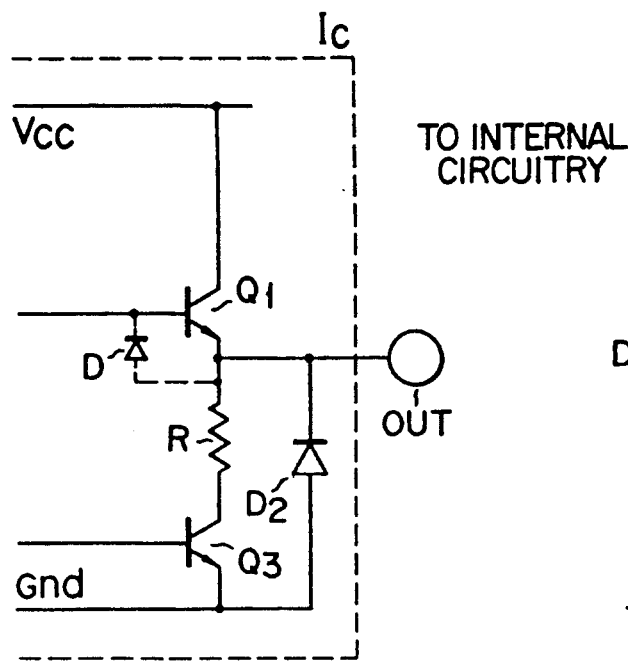
FIGS. 3 and 4 are circuit diagrams showing other embodiments of an electrostatic protector according to the present invention.

Turning now to FIG. 3, there is shown another output circuit incorporating an electrostatic protector according to the present invention. The output circuit of FIG. 3 is characterized in having an additional collector-emitter path of an NPN transistor $Q_3$ for emitter current control inserted between the resistor R and the ground line of the output circuit of FIG. 1. For simplicity, like reference symbols are used in FIG. 3 to designate portions like or equivalent to those in FIG. 1. It is evident that the output circuit of FIG. 3, like the output circuit of FIG. 1, protects the base-emitter junction of the transistor $Q_1$ against a surge voltage.

Figure 4:
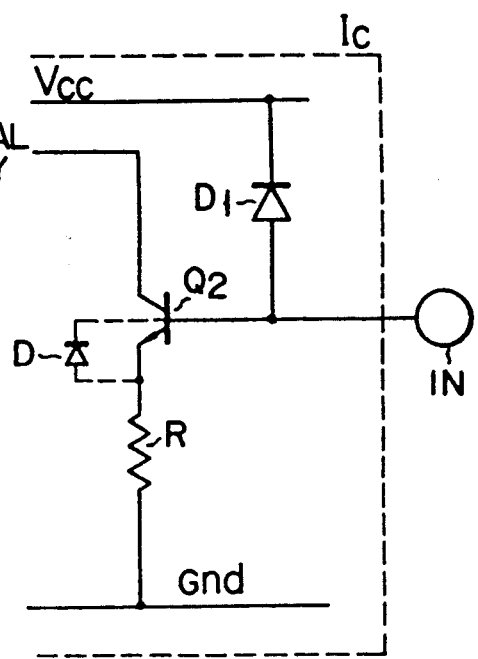
Figure 5:
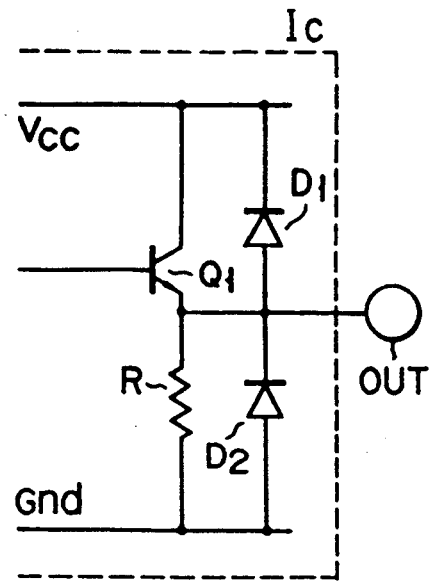
FIGS. 5 to 7 are circuit diagrams of prior art electrostatic protectors to which the present invention is not applied.
Figure 6:
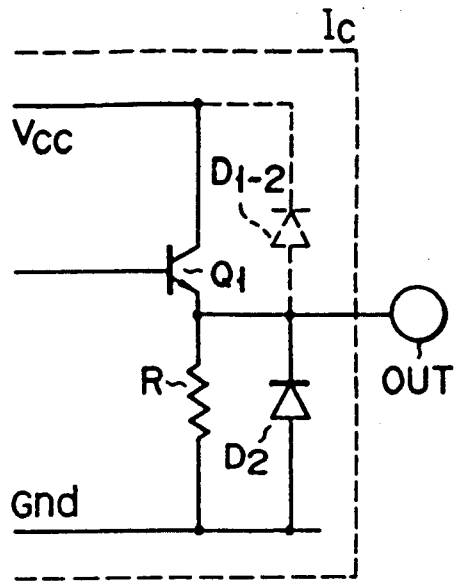

FIG. 4 shows another input circuit used in a semiconductor integrated circuit and which incorporates an electrostatic protector according to the present invention. As shown, a resistor R is connected between the emitter of an NPN transistor $Q_2$ and the ground line. The base of the transistor $Q_2$ is connected to the input terminal IN, and the collector of the transistor $Q_2$ is connected to an internal circuit of the IC which is not shown. A diode $D_1$ for absorbing a positive surge current is inserted between the base of the transistor $Q_2$ and the power line Vcc.

In the input circuit of FIG. 4, as in the FIG. 2 circuit, an N type island region containing a P type diffusion region of resistor is connected to the base interconnection wire, and is coupled for reception with a potential equal to that at the base of the input transistor $Q_2$.

The input circuit of FIG. 4 protects the base-emitter junction of the transistor $Q_2$ against a positive surge voltage applied by the diode $D_1$. In the case of a negative surge voltage being applied, an equivalent diode D, located between the emitter and base of the transistor $Q_2$, operates to absorb the negative surge current caused by the negative surge voltage. The base-emitter junction of the transistor $Q_2$ is protected against negative surge voltage entering through the input terminal IN.

Figure 7:
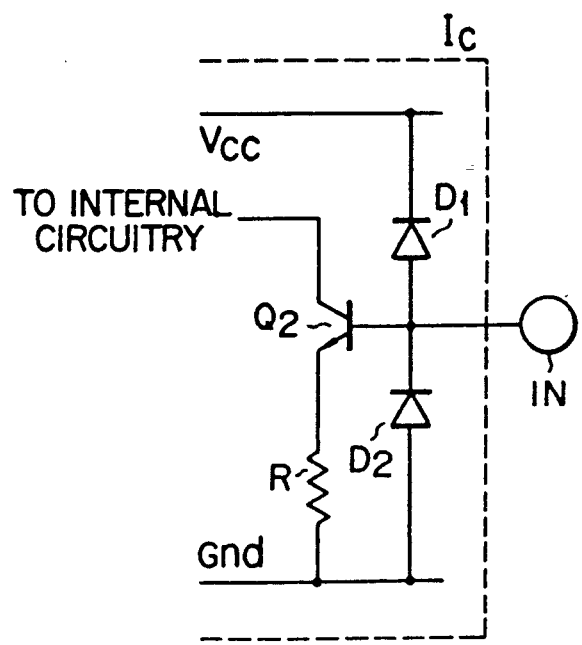

Thus, the base-emitter junction of the transistor $Q_2$ can be protected from the negative surge voltage, irrespective of the impedance state of the ground line. Further, the diode shown as $D_2$ for connected between the base of the transistor $Q_2$ and the ground line for absorbing the negative surge current in the prior art circuit of FIG. 7 can be eliminated.

The resistor R used in each of the embodiments described above can be formed by use of a solid phase diffusion process or a thermal diffusion process, following ion implantation. In other words, any P type resistor region formed in the N type island region suffices for the resistor, even if any process to form the resistor is used.

Figure 8:
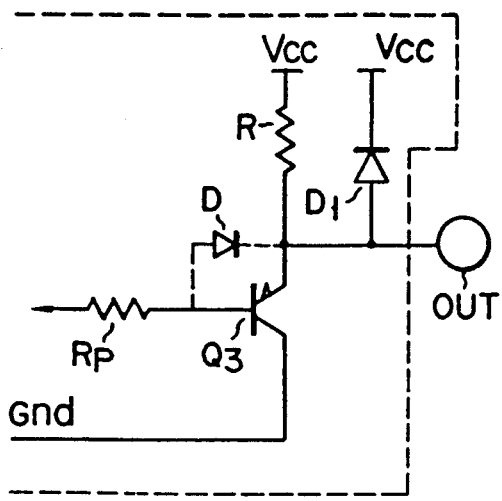
FIG. 8 is a circuit diagram showing another embodiment of an electrostatic protector according to the present invention.
Figure 9:
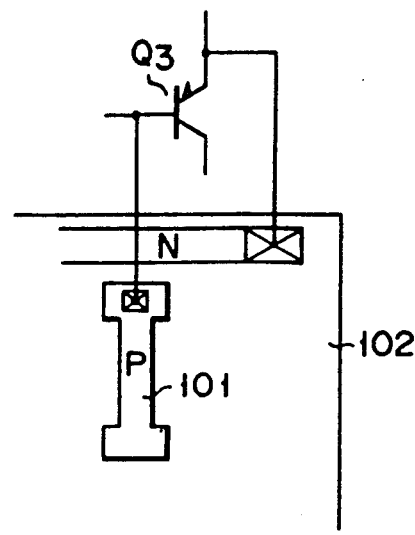
FIG. 9 is a pattern illustration of the electrostatic protector of FIG. 8.

FIG. 8 is a circuit diagram of another embodiment of the present invention, while FIG. 9 is a structural and schematical illustration of the electrostatic protector shown in FIG. 8. In this embodiment, a PNP bipolar transistor $Q_3$ is used in place of the NPN transistor $Q_1$ utilized in the embodiment of FIG. 1, and a diode D is equivalently formed by P type resistor Rp, formed in N type resistor Rp, and the N type resistor island. Further, a potential equal to that at the emitter of the transistor $Q_3$ is applied to the N type resistor island 102. With this, a parasitic diode D is formed between a P type region 101 serving as a resistor connecting to the base of the transistor $Q_3$, and the N type resistor island 102. This diode D protects the emitter-base junction of the diode $Q_3$ against a negative serve voltage. In this instance, a diode $D_1$ is used for protecting the transistor from a positive surge voltage.

Figure 10:
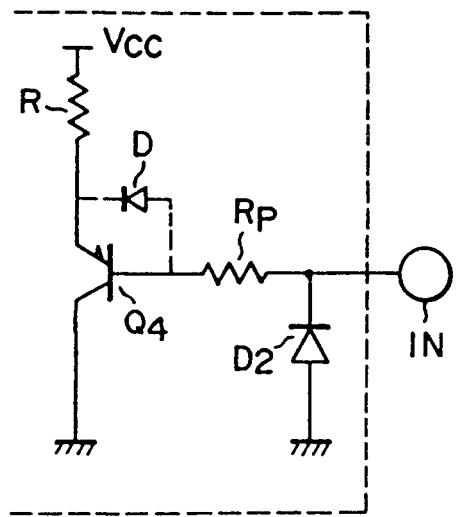
FIGS. 10 and 11 are circuit diagrams showing additional embodiments of an electrostatic protector according to the present invention.
Figure 11:
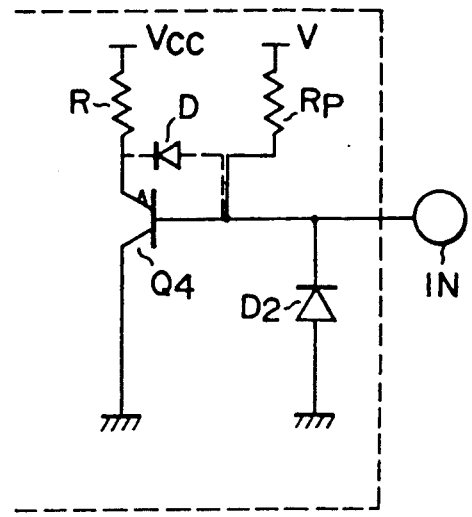

FIGS. 10 and 11 are circuit diagrams showing further embodiments of the present invention. In FIG. 10, a base of a PNP bipolar transistor $Q_4$ is connected at its base to a P type resistor formed in an N type resistor island. The N type resistor island and a P type resistor Rp together form a diode D situated between the base and emitter of the transistor $Q_4$. The diode D functions to protect the base-emitter junction of the transistor against a positive surge voltage. Another diode $D_2$ is also provided as a protecting means against the negative surge voltage.

In the circuit of FIG. 11, a P type resistor Rp, used an input resistor, is coupled with a second power source. As a matter of course, electrostatic protection of the base-emitter junction of transistor $Q_4$ is provided by the equivalent diode formed by the diffused resistor Rp. A diode $D_2$ is used for protecting the base-emitter junction of the transistor against a surge voltage.

Figure 12:
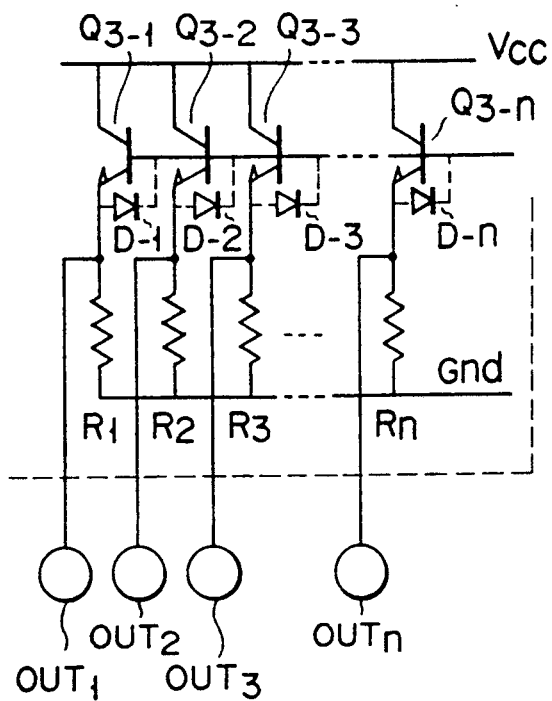
FIG. 12 is a circuit diagram showing an output circuit having a plurality of output terminals incorporating an electrostatic protector according to the present invention.
Figure 13:
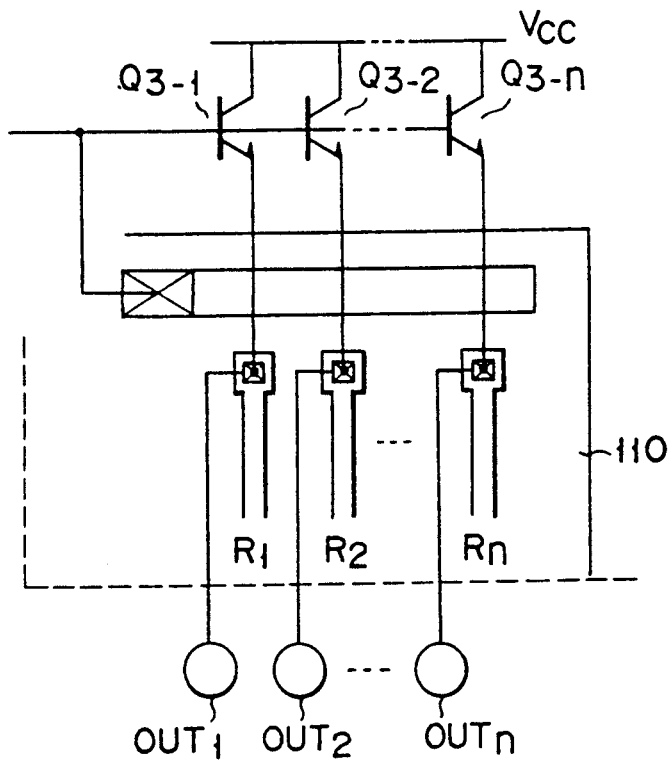
FIG. 13 is a structural and schematic illustration of the protector of FIG. 12.

FIG. 12 shows an output circuit having a plurality of output terminals which incorporates electrostatic protectors according to the present invention, while FIG. 13 is a schematical and structural illustration of the output circuit of FIG. 12. In FIG. 12, $Q_{3-1}$ to $Q_{3-n}$ designate bipolar transistors, and D-1 to D-n represent diode components formed between the emitter and base of the bipolar transistors, respectively. Resistors $R_1$ to Rn are P type resistors of "n" which are formed in line in an N type resistor island 110. A potential of common bases of transistor $Q_{3-1}$ to $Q_{3-n}$ supplies the resistor island 110. Therefore, the N type resistor island 110 and the P type resistors $R_l$ to Rn provide equivalent PN junctions to serve as the diodes D-1 to D-n.

As described above, in the instant embodiment, a plurality of resistors are formed in the single N type resistor island. As a result, the chip area required for forming the circuit is less than in the case where the islands are respectively used for the resistors.

Figure 14:
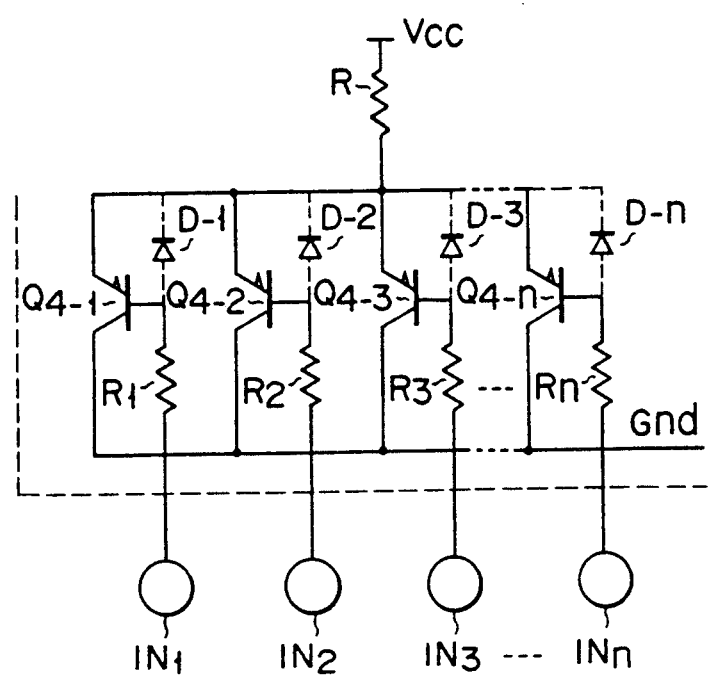
FIG. 14 is a circuit diagram showing an input circuit having a plurality of input terminals incorporating an electrostatic protector according to the present invention.

FIG. 14 shows an input circuit having a plurality of input terminals which incorporates electrostatic protectors according to the present invention. In this figure, R designates a resistor of a given resistance; $Q_{4-1}$ to $Q_{4-n}$, bipolar transistors; and D-1 to D-n, diodes formed between the emitter and base of the transistors. In this embodiment also, a plurality of resistors $R_l$ to Rn are formed in line in an N type resistor island, thereby to reduce the chip area required for forming the circuit. The PN junctions between the resistors $R_l$ to Rn and the N type resistor island, respectively, serve as the diodes D-1 to D-n as the diodes for protecting the base-emitter junction of transistor against an incoming surge voltage.

Figure 15:
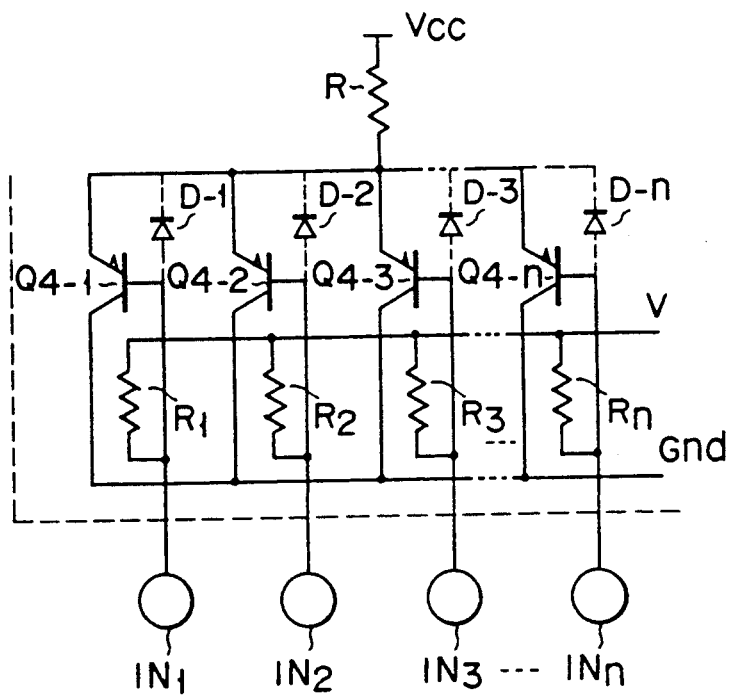
FIG. 15 is a circuit diagram showing another input circuit having a plurality of input terminals incorporating an electrostatic protector according to the present invention.

FIG. 15 shows another input circuit with a plurality of input terminals which incorporates electrostatic protectors according to the present invention. In the figure, resistors $R_1$ to Rn are used as input resistor, are coupled with another voltage V. Protective diodes D-1 to D-n, respectively, are constituted by the PN junctions between the resistors $R_l$ to Rn and the single N type resistor island.

FIGS. 16 and 17 are circuit diagrams showing differential amplifiers incorporating electrostatic protectors according to the present invention. In the differential amplifier of FIG. 16, P type resistors $R_1$ and $R_2$ are seriesly connected to the base of the transistors. In the amplifier of FIG. 17, the P type resistors are used as input resistors. To stabilize the circuit operation, those resistors are coupled with another power source V. Also in the embodiments, diodes D-1 and D-2 are used for protecting the bipolar transistors against a surge voltage.

It is evident that, in the embodiments described above, the input circuit may be used as the output circuit if a circuit arrangement of an external circuit of the buffer circuit according to the present invention, and the converse is also true.

As can be seen from the foregoing description, the electrostatic protector according to the present invention is capable of protecting the base-emitter junction of an input or an output NPN or PNP transistor against an incoming surge voltage, irrespective of the impedance state of the power line or the ground line.

A P type resistor region formed in an N type island region of a semiconductor substrate is connected between the emitter of the NPN or PNP transistor and the ground line. The N type island is electrically coupled with the base region of the transistor. A parasitic element resulting from such an arrangement is used as a diode for absorbing a surge current. The arrangement is simple in construction and is suitable for IC fabrication.

Use of the parasitic element as the surge current absorbing diode does not result in an increase in the number of circuit elements required. When comparing with the circuit arrangement, for one input or output terminal, the surge current absorbing diode can be saved by at least one.

To ensure protection of the transistor against a surge voltage, the surge current absorbing diode is directly connected between the base and emitter of the NPN transistor to be protected.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A semiconductor input buffer circuit for a semiconductor circuit comprising:
   a first power source;
   an input node; and
   a bipolar transistor on a substrate having a collector coupled to the semiconductor circuit, an emitter coupled to said first power source through a resistor formed by a P-type diffusion region in an N-type resistor island region of said substrate, and a base coupled to the input node and the N-type resistor island region of said resistor
   wherein the N-type resistor island region and the P-type diffusion region form a diode structure between the emitter and base of said bipolar transistor such that the cathode of the diode structure is coupled to the base and the anode of the diode structure is coupled to the emitter.

2. The semiconductor input buffer circuit according to claim 1, further comprising a diode and a second power source, said second diode coupled between said second power source and the base of said bipolar transistor such that the cathode of the diode is coupled to the second power source and the anode of the diode is coupled to the base of the transistor.

3. The semiconductor input buffer circuit according to claim 1, wherein said bipolar transistor is an npn transistor.

4. A semiconductor input buffer circuit comprising:
   a first and second power source;
   an input node; and
   a bipolar transistor on a substrate having a collector coupled to said first power source, a base coupled to the input node through a resistor formed by a P-type diffusion region in an N-type resistor island region of said substrate, and an emitter coupled to said second power source through a coupling resistor and to the N-type resistor island region
   wherein the N-type resistor island region and the P-type diffusion region form a diode structure between the emitter and base of said bipolar transistor such that the anode of the diode structure is coupled to the base and the cathode of the diode structure is coupled to the emitter.

5. The semiconductor input buffer circuit according to claim 4, further comprising a coupled between said first power source and the input node such that the anode of the diode is coupled to the first power source and the cathode of the diode is coupled to the input node.

6. The semiconductor input buffer circuit according to claim 4, wherein said bipolar transistor is a pnp transistor.

7. A semiconductor output buffer circuit for a semiconductor circuit comprising:
   first and second power sources;
   an output node; and
   a bipolar transistor on a substrate having a collector coupled to said first power source, an emitter coupled to the output node and to said second power source through a resistor formed by a P-type diffusion region in an N-type resistor island region of said substrate, and a base coupled to the N-type resistor island region of the resistor,
   wherein the N-type resistor island region and the P-type diffusion region form a diode structure between the emitter and base of said bipolar transistor such that the cathode of the diode structure is coupled to the base and the anode of the diode structure is coupled to the emitter.

8. The semiconductor output buffer circuit according to claim 7 further comprising a diode coupled between the output node and the second power source such that the anode of the diode is coupled to the second power source and the cathode of the diode is coupled to the output node.

9. The semiconductor output buffer circuit according to claim 7, wherein the bipolar transistor is an npn transistor.

10. The semiconductor output buffer circuit according to claim 8 further comprising a second bipolar transistor coupled between the resistor formed by a P-type diffusion region in an N-type resistor island region and the second power source such that the collector of the second bipolar transistor is coupled to the resistor, the emitter of the second bipolar transistor is coupled to the second power source and the base of the second bipolar transistor is coupled to the semiconductor circuit.

11. A semiconductor output buffer circuit for a semiconductor circuit comprising:
    an output node; and
    a bipolar transistor having a collector coupled to a first power source, a base coupled the semiconductor circuit through a first resistor formed by a P-type diffusion fusion region in an N-type resistor island region, and an emitter coupled to the output node, to a second power source through a second resistor, and to the N-type resistor island region,
    wherein the N-type resistor island region and the P-type diffusion region forms a diode structure between the base and emitter of said bipolar transistor such that the anode of the diode structure is coupled to the base and the cathode of the diode structure is coupled to the emitter.

12. The semiconductor output buffer circuit according to claim 11 further comprising a diode coupled between the output node and the second power source such that the cathode of the diode is coupled to the second power source and the anode of the diode is coupled to the output node.

13. The semiconductor output buffer circuit according to claim 11, wherein the bipolar transistor is a pnp transistor.

14. A semiconductor input buffer circuit comprising:
    an input node; and
    a bipolar transistor having a collector coupled to a first power source, a base coupled to the input node and to a second power source through a resistor formed by a P-type diffusion region in an N-type resistor island region and an emitter coupled to a third power source through a resistor and to the N-type resistor island region,
    wherein the N-type resistor island region and the P-type diffusion region forms a diode structure between the emitter and base of said bipolar transistor such that the cathode of the diode structure is coupled to the emitter and the anode of the diode structure is coupled to the base.

15. The semiconductor input buffer circuit according to claim 14, further comprising a diode coupled between said first power source and the input node such that the anode of the diode is coupled to the first power source and the cathode of the diode is coupled to the input node.

16. A semiconductor output buffer circuit comprising:
a plurality of output nodes formed on a semiconductor substrate;
a plurality of output bipolar transistors formed on the semiconductor substrate such that a bipolar transistor corresponds to each output node, each of the transistors having a collector coupled to a first power source, an emitter coupled to the corresponding output node, and a base; and
a plurality of resistors each formed from a P-type semiconductor diffusion region is an N-type semiconductor island region such that a resistor corresponds to each bipolar transistor of the plurality of bipolar transistors, the N-type semiconductor island region being formed in the semiconductor substrate, each of the plurality of resistors having a first and second end, the first end of each of resistor being coupled to the emitter of the corresponding bipolar transistor, and the second end of each of the resistors being coupled to a second power source, and the N-type semiconductor island region of each resistor being coupled to the base of each corresponding bipolar transistor, wherein each P-type semiconductor diffusion region with its N-type semiconductor island region form a diode structure between the emitter and the base of each bipolar transistor such that the anode and cathode of each diode structure is coupled to the emitter and base of each bipolar transistor, respectively.

17. The semiconductor output buffer circuit according to claim 16, wherein the N-type semiconductor island region of each of the plurality of resistors forms a single N-type semiconductor island region.

18. The semiconductor output buffer circuit according to claim 16 further comprising a plurality of diodes such that a diode corresponds to each output node, each diode being coupled between the corresponding output node and the second power source such that the anode of the diode is coupled to the second power source and the cathode of the diode is coupled to the corresponding output node.

19. The semiconductor output buffer circuit according to claim 17 further comprising a plurality of diodes such that a diode corresponds to each output node, each diode being coupled between the corresponding output node and the second power source such that the anode of the diode is coupled to the second power source and the cathode of the diode is coupled to the corresponding output node.

20. A semiconductor input buffer circuit comprising:
a plurality of input nodes formed on a semiconductor substrate; and
a plurality of bipolar transistors formed on the semiconductor substrate such that a bipolar transistor corresponds to each input node, each of the bipolar transistors having a collector coupled to a first power source, a base coupled to the corresponding input node through one of a plurality of diffusion resistors, each diffusion resistor being formed by a P-type semiconductor diffusion region in an N-type semiconductor island region, the N-type semiconductor island region formed in the semiconductor substrate, and an emitter coupled to a second power source through a coupling resistor and to the N-type semiconductor island region of the diffusion resistor;
wherein the P-type semiconductor diffusion region and the N-type semiconductor island region region of each diffusion resistor forms a diode structure between the emitter and base of the corresponding bipolar transistor such that the anode of the diode structure is coupled to the base and the cathode of the diode structure is coupled to the emitter of the corresponding bipolar transistor.

21. The semiconductor input buffer circuit according to claim 20, wherein the N-type semiconductor island region of each of the plurality of diffusion resistors from a single N-type semiconductor island region.

22. The semiconductor input buffer circuit according to claim 20, further comprising a plurality of diodes such that a diode corresponds to each input node, each diode being coupled between said first power source and the corresponding input node such that the anode of the diode is coupled to the first power source and cathodes of the diode is coupled to the corresponding input node.

23. The semiconductor input buffer circuit according to claim 21, further comprising a plurality of diodes such that a diode corresponds to each input node, each diode being coupled between said first power source and the corresponding input node such that the anode of the diode is coupled to the first power source and the cathode of the diode is coupled to the corresponding input node.

24. A semiconductor input buffer circuit comprising:
a plurality of input nodes formed on a semiconductor substrate;
a plurality of bipolar transistors formed on the semiconductor substrate such that a bipolar transistor corresponds to each input node, each of the bipolar transistors having a collector coupled to a first power supply source, a base coupled to the corresponding input node and to a second power source through a diffusion resistors formed by a P-type semiconductor diffusion region in an N-type semiconductor island region, the N-type semiconductor island region formed in the semiconductor substrate, and an emitter coupled to third power source and to the N-type semiconductor island region of the diffusion resistor,
wherein the P-type semiconductor diffusion region and the N-type semiconductor island region of each diffusion resistor forms a diode structure between the emitter and base of each bipolar transistor such that the cathode of the diode structure is coupled to the emitter and the anode of the diode structure is coupled to the base.

25. The semiconductor input buffer circuit according to claim 24, wherein the N-type semiconductor island region of each of the plurality of diffusion resistors forms a single N-type semiconductor island region.

26. The semiconductor input buffer circuit according to claim 24, further comprising a plurality of diodes such that a diode corresponds to each input node, each diode being coupled between said first power source and the corresponding input node so that the anode of the diode is coupled to the first power source and the cathode of the diode is coupled to the corresponding input node.

27. The semiconductor input buffer circuit according to claim 25, further comprising a plurality of diodes such that a diode corresponds to each input node, each diode being coupled between said first power source and the corresponding input node so that the anode of the diode is coupled to the first power source and the cathode of the diode is coupled to the corresponding input node.

* * * * *